United States Patent
Kim et al.

(10) Patent No.: US 7,540,935 B2
(45) Date of Patent: Jun. 2, 2009

(54) PLASMA OXIDATION AND REMOVAL OF OXIDIZED MATERIAL

(75) Inventors: Yunsang Kim, San Jose, CA (US); Andrew D. Bailey, III, Pleasanton, CA (US); Hyungsuk Alexander Yoon, San Jose, CA (US); Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 446 days.

(21) Appl. No.: 11/076,725

(22) Filed: Mar. 9, 2005

(65) Prior Publication Data

US 2006/0128152 A1   Jun. 15, 2006

Related U.S. Application Data

(63) Continuation-in-part of application No. 10/769,498, filed on Jan. 30, 2004, now Pat. No. 7,078,344, and a continuation-in-part of application No. 10/769,408, filed on Jan. 30, 2004, now Pat. No. 7,232,766, and a continuation-in-part of application No. 10/769,522, filed on Jan. 30, 2004, now Pat. No. 7,217,649, and a continuation-in-part of application No. 10/744,355, filed on Dec. 22, 2003, now Pat. No. 7,009,281, each of which is a continuation-in-part of application No. 10/390,117, filed on Mar. 14, 2003, and a continuation-in-part of application No. 10/390,527, filed on Mar. 14, 2003.

(51) Int. Cl.
*H01L 21/302* (2006.01)
*H01L 21/461* (2006.01)

(52) U.S. Cl. ............... 156/345.26; 438/690; 257/E21.3
(58) Field of Classification Search .............. None
See application file for complete search history.

(56) References Cited

U.S. PATENT DOCUMENTS

| 4,468,284 | A | * | 8/1984 | Nelson | 438/720 |
|---|---|---|---|---|---|
| 4,919,750 | A | * | 4/1990 | Bausmith et al. | 216/66 |
| 5,098,516 | A | * | 3/1992 | Norman et al. | 216/78 |
| 5,424,246 | A | * | 6/1995 | Matsuo et al. | 438/642 |
| 5,431,774 | A | * | 7/1995 | Douglas | 216/57 |
| 5,561,082 | A | * | 10/1996 | Matsuo et al. | 438/396 |
| 5,736,002 | A | * | 4/1998 | Allen et al. | 438/705 |
| 5,953,634 | A | * | 9/1999 | Kajita et al. | 438/687 |
| 6,090,701 | A | * | 7/2000 | Hasunuma et al. | 438/632 |
| 6,171,661 | B1 | * | 1/2001 | Zheng et al. | 427/535 |
| 6,355,106 | B1 | * | 3/2002 | Zheng et al. | 118/697 |
| 6,403,491 | B1 | * | 6/2002 | Liu et al. | 438/710 |

(Continued)

OTHER PUBLICATIONS

Written Opinion of the International Search Authority (Oct. 22, 2007) (8 pages).

*Primary Examiner*—Allan Olsen
(74) *Attorney, Agent, or Firm*—Martine Penilla & Gencarella, LLP

(57) ABSTRACT

A method of etching a conductive layer includes converting at least a portion of the conductive layer and etching the conductive layer to substantially remove the converted portion of the conductive layer and thereby expose a remaining surface. The remaining surface has an average surface roughness of less than about 10 nm. A system for etching a conductive layer is also disclosed.

21 Claims, 8 Drawing Sheets

U.S. PATENT DOCUMENTS

| | | | |
|---|---|---|---|
| 6,518,183 B1 * | 2/2003 | Chang et al. | 438/687 |
| 6,613,667 B1 | 9/2003 | Kuo | |
| 6,790,774 B2 * | 9/2004 | Fujikawa et al. | 438/660 |
| 6,794,245 B2 * | 9/2004 | Zheng | 438/255 |
| 6,797,640 B2 * | 9/2004 | Tesauro et al. | 438/717 |
| 6,821,899 B2 * | 11/2004 | Lohokare et al. | 438/697 |
| 6,903,008 B2 * | 6/2005 | Abe | 438/637 |
| 7,037,832 B1 * | 5/2006 | Kuo | 438/669 |
| 7,037,836 B2 * | 5/2006 | Lee | 438/687 |
| 7,099,013 B2 * | 8/2006 | Katz et al. | 356/445 |
| 7,129,167 B1 * | 10/2006 | Bailey et al. | 438/677 |
| 7,217,649 B2 * | 5/2007 | Bailey et al. | 438/622 |
| 7,232,766 B2 * | 6/2007 | Bailey et al. | 438/714 |
| 2003/0032221 A1 * | 2/2003 | Kasahara et al. | 439/149 |
| 2004/0165177 A1 | 8/2004 | Katz et al. | |
| 2004/0248408 A1 * | 12/2004 | Lohokare et al. | 438/647 |
| 2005/0287698 A1 * | 12/2005 | Li et al. | 438/102 |

* cited by examiner

PLASMA OXIDATION AND REMOVAL OF OXIDIZED MATERIAL

CROSS REFERENCE TO RELATED APPLICATIONS

This application is a continuation-in-part of and claims priority from U.S. patent application Ser. No. 10/769,498 filed on Jan. 30, 2004 now U.S. Pat. No. 7,078,344 and entitled "Stress Free Etch Processing in Combination with a Dynamic Liquid Meniscus," by Bailey III et al., which is incorporated herein by reference in its entirety. This application is also a continuation-in-part of and claims priority from U.S. patent application Ser. No. 10/744,355 filed on Dec. 22, 2003 now U.S. Pat. No. 7,009,281 and entitled "Small Volume Process Chamber with Hot Inner Surfaces," by Bailey III et al., which is incorporated herein by reference in its entirety. This application is also a continuation-in-part of and claims priority from U.S. patent application Ser. No. 10/769,408 filed on Jan. 30, 2004 now U.S. Pat. No. 7,232,766 and entitled "System and Method for Surface Reduction, Passivation, Corrosion Prevention and Activation of Copper Surface," by Bailey III et al., which is incorporated herein by reference in its entirety. This application is also a continuation-in-part of and claims priority from U.S. patent application Ser. No. 10/769,522 filed on Jan. 30, 2004 now U.S. Pat. No. 7,217,649 and entitled "System and Method For Stress Free Conductor Removal," by Bailey III et al., which is incorporated herein by reference in its entirety. Each one of U.S. patent applications Ser. Nos. 10/769,498, 10/744,355, 10/769,408 and 10/769,522 are all continuation-in-parts of and claim priority from U.S. patent application Ser. No. 10/390,117 filed on Mar. 14, 2003 and entitled "System, Method and Apparatus For Improved Global Dual-Damascene Planarization," by Bailey III et al., which is incorporated herein by reference in its entirety. Each one of U.S. patent applications Ser. Nos. 10/769,498, 10/744,355, 10/769,408 and 10/769,522 are all also continuation-in-parts of and claim priority from U.S. patent application Ser. No. 10/390,520 filed on Mar. 14, 2003 and entitled "System, Method and Apparatus For Improved Local Dual-Damascene Planarization," by Bailey III et al., which is incorporated herein by reference in its entirety.

BACKGROUND OF THE INVENTION

1. Field of the Invention

The present invention relates generally to dual damascene semiconductor manufacturing processes, and more particularly, to methods and systems for planarizing features and layers and controlling surface roughness in a semiconductor manufacturing process.

2. Description of the Related Art

Dual damascene manufacturing processes are becoming more common in semiconductor manufacturing. In a typical dual damascene manufacturing process, one or more conductive materials are deposited in previously patterned trenches and vias formed in a semiconductor substrate or films formed on the semiconductor substrate to form the desired electrical circuit interconnects. An excess or overburden portion of the conductive material is often formed. The overburden portion of the conductive material is unnecessary and undesirable and must be removed both to produce a damascene feature and to provide a uniform and planar surface for subsequent processing.

The overburden portion of the conductive material is typically removed from the semiconductor substrate through chemical mechanical polishing (CMP) and electro-chemical polishing (ECP) (e.g., etching) processes and combinations of CMP and ECP processes. Each of these processes has significant shortfalls. By way of example, ECP typically has a relatively low throughput, poor uniformity and inability to effectively remove non-conductive material.

CMP requires physical contact processes which typically leave conductive residues, or cause corrosion of the various materials, or result in non-uniform removal, and the inability to suitably planarize interconnect and interlevel dielectric (ILD) top surface. CMP can also cause stress related damage (e.g., interlayer delamination, peeling) to remaining interconnect and ILD structures. The CMP-caused stress damage is further exacerbated by the very poor inter-layer adhesion characteristics of the more-recently used materials. Reducing the physical force of the CMP process to reduce the physical stress can often result in unacceptably low throughput rates and other poor process performance parameters.

In view of the foregoing, there is a need for an improved system and method to remove at least a portion of a layer and to provide a substantially smooth surface while minimizing physical stress to the remaining features. The improved system and method should be suitable for use in semiconductor manufacturing and should be applicable to processes such as a dual damascene process or other semiconductor manufacturing processes.

SUMMARY OF THE INVENTION

Broadly speaking, the present invention fills these needs by providing a system and method for etching a conductive layer. It should be appreciated that the present invention can be implemented in numerous ways, including as a process, an apparatus, a system, computer readable media, or a device. Several inventive embodiments of the present invention are described below.

One embodiment provides a method of etching a conductive layer includes converting at least a portion of the conductive layer and etching the conductive layer to substantially remove the converted portion of the conductive layer and thereby expose a remaining surface. The remaining surface has an average surface roughness of less than about 10 nm.

The conductive layer can include a copper layer or copper alloy layer. Converting the at least a portion of the conductive layer can include oxidizing the at least a portion of the conductive layer. Converting the at least a portion of the conductive layer can include nitriding the at least a portion of the conductive layer.

The conductive layer can be formed on an underlying layer. The underlying layer can be formed on a substrate. The underlying layer can be a barrier layer. Converting the at least a portion of the conductive layer can include converting substantially the entire conductive layer and converting at least a portion of the underlying layer.

Converting the at least a portion of the conductive layer can occur substantially simultaneously with etching the conductive layer to substantially remove the converted portion of the conductive layer.

Converting the at least a portion of the conductive layer can occur in-situ with etching the conductive layer to substantially remove the converted portion of the conductive layer.

Etching the conductive layer to substantially remove the converted portion of the conductive layer can include etching with $BCl_3$. Converting the at least a portion of the conductive layer can include oxidizing the at least a portion of the conductive layer with an oxidizing mixture including chlorine and oxygen.

Converting the at least a portion of the conductive layer can include oxidizing the at least a portion of the conductive layer with an oxidizing mixture including argon and oxygen. Converting the at least a portion of the conductive layer can include converting the at least a portion of the conductive layer at a temperature greater than about 200 degrees C. Converting the at least a portion of the conductive layer can include converting the at least a portion of the conductive layer in a plasma.

Etching the conductive layer to substantially remove the converted portion of the conductive layer can include etching the conductive layer at a temperature of less than about 150 degrees C. Etching the conductive layer to substantially remove the converted portion of the conductive layer can include etching with a dynamic liquid meniscus. Etching the conductive layer to substantially remove the converted portion of the conductive layer can include etching the conductive layer in a plasma.

The average surface roughness of the remaining surface is less than about 0.04 times a thickness of the converted portion of the conductive layer. Converting the at least a portion of the conductive layer and etching the conductive layer to substantially remove the converted portion of the conductive layer occurs substantially simultaneously.

Another embodiment provides a method of etching a copper layer including oxidizing at least a portion of the copper layer with a first plasma in a plasma chamber at a temperature greater than about 200 degrees C. The copper layer is etched to substantially remove the oxidized portion of the copper layer to expose a remaining surface. The remaining surface having an average surface roughness of less than about 10 nm. The copper layer is etched with second plasma in the plasma chamber at a temperature of less than about 100 degrees C.

Yet another embodiment provides a system for etching a conductive layer. The system includes a plasma chamber. The plasma chamber capable of enclosing a substrate and the substrate having an exposed layer of conductive material. The plasma chamber capable of supporting a first plasma at a temperature of greater than about 200 degrees C. and a second plasma at less than about 100 degrees C. The system also includes a converting species source coupled to the plasma chamber and an etching species source coupled to the plasma chamber. The system also includes a controller coupled to the plasma chamber. The controller is capable of controlling a flow of the converting species and the etching species into the plasma chamber. The controller also includes a recipe. Optionally, the system can also include a dynamic liquid meniscus etch process chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Figure 1A:
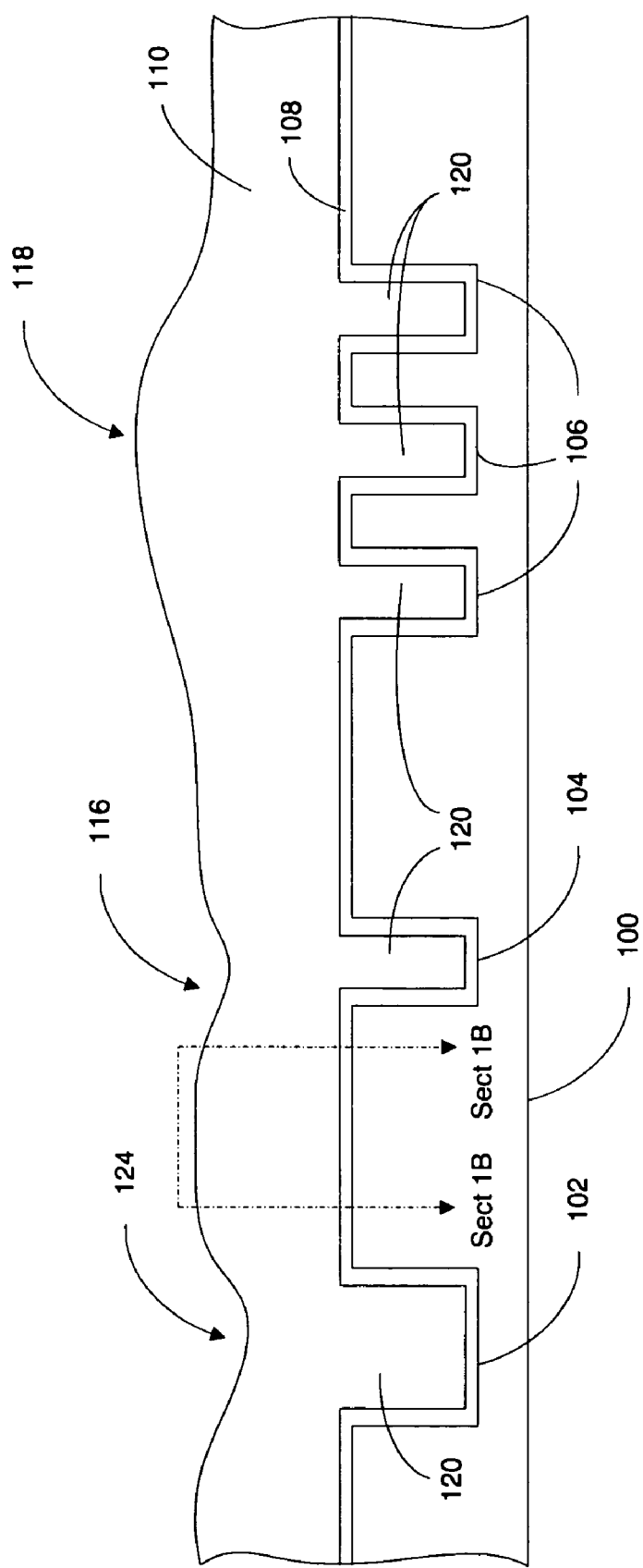
FIG. 1A shows a patterned semiconductor substrate in a dual damascene process, in accordance with one embodiment of the present invention.

Several exemplary embodiments for an improved system and method of etching copper layers will now be described. It will be apparent to those skilled in the art that the present invention may be practiced without some or all of the specific details set forth herein.

Copper and copper alloys are becoming widely used conductive materials in the semiconductor manufacturing processes. By way of example, many conductive traces and vias are used to form interconnects between devices formed in the semiconductor. Such copper and copper alloy interconnects are often formed in damascene and dual damascene structures.

A first layer typically has trenches and via holes formed therein. A conductive material is then filled into and over the trenches and via holes. As a result, a significant portion of the conductive material forms an overburden portion that is unevenly distributed over the trenches and via holes. The overburden portion must be removed to eliminate undesirable short circuits and to provide a substantially planar surface for a subsequent semiconductor processes.

Typically, the overburden portion is removed with a CMP process or similar mechanical means. Unfortunately, as described above, CMP can impart excess stress to the semiconductor structure and thereby damage the interconnect structures and the underlying layers.

Various methods of etching and stress-free planarization are described in U.S. patent application Ser. No. 10/769,498, entitled "Stress Free Etch Processing in Combination with a Dynamic Liquid Meniscus," by Bailey III et al. and U.S. patent application Ser. No. 10/744,355, entitled "Small Volume Process Chamber with Hot Inner Surfaces," by Bailey III et al., and U.S. patent application Ser. No. 10/769,408, entitled "System and Method for Surface Reduction, Passivation, Corrosion Prevention and Activation of Copper Surface," by Bailey III et al., and U.S. patent application Ser. No. 10/769,522, entitled "System and Method For Stress Free Conductor Removal," by Bailey III et al., and U.S. patent application Ser. No. 10/390,117 filed on Mar. 14, 2003 and entitled "System, Method and Apparatus For Improved Global Dual-Damascene Planarization," by Bailey III et al., and U.S. patent application Ser. No. 10/390,520 filed on Mar. 14, 2003 and entitled "System, Method and Apparatus For Improved Local Dual-Damascene Planarization," by Bailey III et al., each of which are incorporated herein by reference in its entirety for all purposes.

Etching the copper overburden layer can be used to remove and planarize the overburden copper layer. Unfortunately most prior art copper etching processes cause excess surface roughness of the copper etch front (i.e., the remaining copper surface). The excess surface roughness can cause increased device failure probabilities through multiple pathways. By way of example, the excess surface roughness promotes formation of voids, electro-migration at the barrier or dielectric cap interface, altered resistivity, excess interconnect and contact resistance at via bottom, to name but a few pathways. Similar problems can also occur in other etch-back approaches including electro-polish and CMP.

FIG. 1A shows a patterned semiconductor substrate 100 in a dual damascene process, in accordance with one embodiment of the present invention. The substrate 100 has been patterned as part of the semiconductor manufacturing process such as a dual damascene manufacturing process. A mask can be used to pattern the substrate 100. The substrate 100 includes a large, somewhat isolated feature 102 (e.g., trench, via, etc.) a smaller, somewhat isolated feature 104 and several features 106 that are densely packed together. A barrier layer 108 is also included. The barrier layer 108 is typically a different material than the substrate 100 or a conductive interconnect material 120. The conductive interconnect material 120 can be copper or copper alloy or other suitable conductive material.

An overburden portion 110 of the conductive interconnect material 120 extends above the features 102, 104, 106 and includes corresponding localized variations 124, 116, 118 in thickness of the overburden portion 110. As shown, the larger feature 102 has a corresponding larger decrease in the thickness of the overburden portion 110 as compared to the smaller feature 104, which has a slightly smaller variation in thickness of the overburden portion 110. The densely packed features 106 have a somewhat increased thickness of the overburden portion 110.

Typical etch processes etch the overburden portion 112 of the conductive interconnect material 120 at a fairly uniform rate over the entire wafer area and therefore the typical etching process will expose the barrier layer 108 near the large feature 102 before the barrier layer 110 near the densely packed features 106 will be exposed. The overburden portion 112 can be mostly removed and planarized in a stress-free planarization process as described above.

Figure 1B:
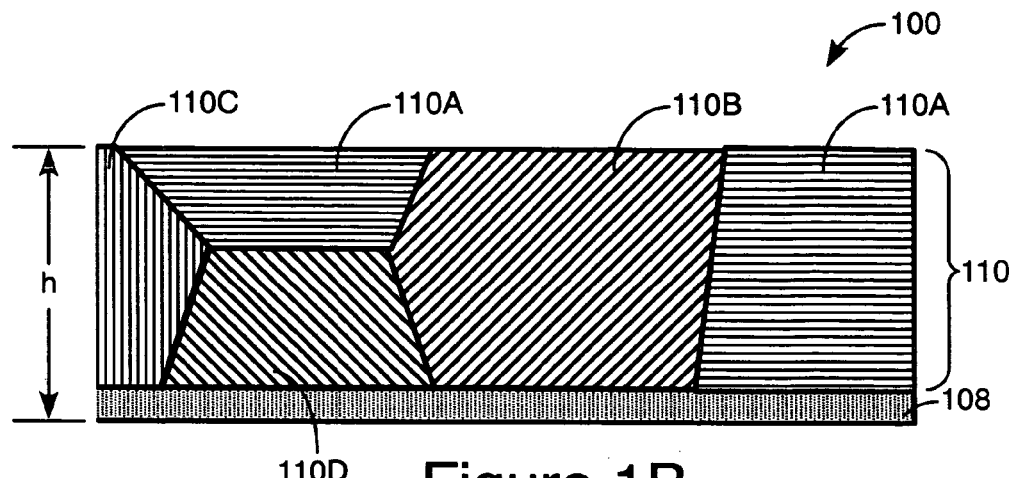
FIG. 1B is a cross-sectional view of layers on a semiconductor substrate, in accordance with one embodiment of the present invention.

FIG. 1B is a cross-sectional view of layers 108 and 110 on a semiconductor substrate 100, in accordance with one embodiment of the present invention. The substrate 100 has a first, underlying layer 108 (e.g., a barrier layer or the substrate) with a copper or copper alloy layer 110 (copper layer 110) formed thereon. The copper layer 110 is formed in multiple crystalline structures 110A-110D. Each of the crystalline structures 110A-110D has a different grain structure as indicated by the different directions of cross-hatching. The crystalline structures 110A-110D can also have boundaries formed between each of the crystalline structures. The underlying layer 108 and the copper layer 110 have a combined thickness of h.

Figure 1C:
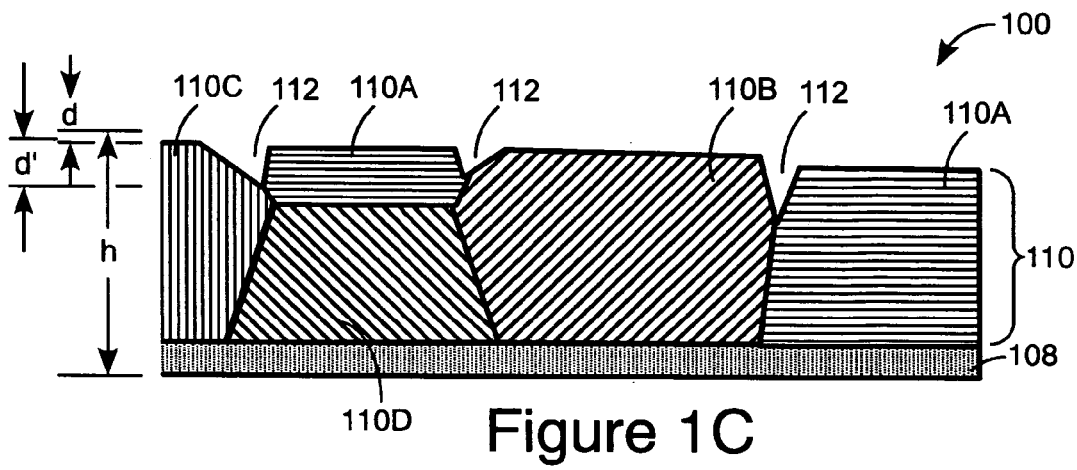
FIGS. 1C and 1D show the cross-sectional view of the layers on the semiconductor substrate after having a typical etch process applied, in accordance with one embodiment of the present invention.
Figure 1D:
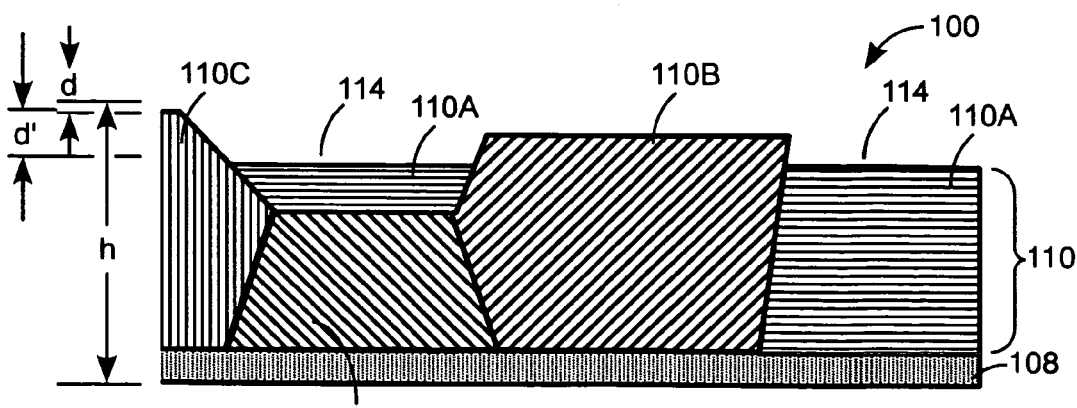

FIGS. 1C and 1D show the cross-sectional view of the layers 108 and 110 on the semiconductor substrate 100 after having a typical etch process applied, in accordance with one embodiment of the present invention. Referring first to FIG. 1C, the copper layer 110 has been etched and the etch process has formed substantial valleys 112 in the boundaries formed between each of the other crystalline structures 110A-110D. By way of example, the surface of the copper layer 110 has been etched to a depth of d while the valleys 112 have been etched an additional depth of about d'. The etching process aggressively etched the boundaries to form the valleys 112. As a result, the remaining surface of the copper layer 110 can be excessively rough.

Referring now to FIG. 1D, the copper layer 110 has been etched. The etch process has unevenly etched the different crystalline structures 110A-110D due at least in part to the different reaction rates between the etchant chemistry and the orientation of the crystalline structures 110A-110D. As a result, the surface of the copper layer 110 has been etched to a depth of d while the valleys 114 have been etched an additional depth of about d". The valleys 114 are formed by the faster first etching rate between the etchant chemistry and the crystalline structures 110A as compared to the slower second etching rate between the etchant chemistry and the crystalline structures 110B and 110C. As a result, the remaining surface of the copper layer 110 can be excessively rough.

The excess roughening of the remaining surface of the copper layer 110 can also be caused by a combination of the etchant chemistry etching the boundaries (i.e., as described in FIG. 1C) and unevenly etching the different crystalline structures 110A-110D. Typical excess roughness is in the range of about 10 to about 100 nm after conventional plasma etch back process. A desirable roughness is less than about 10 nm.

A plasma conversion and removal of the resulting copper compounds can be used to substantially eliminate the excess surface roughness. The plasma conversion and removal process is a stress free process and therefore eliminates stress related issues such as delamination or via pull out at the barrier/dielectric interface typically encountered in conventional CMP.

Figure 2A:
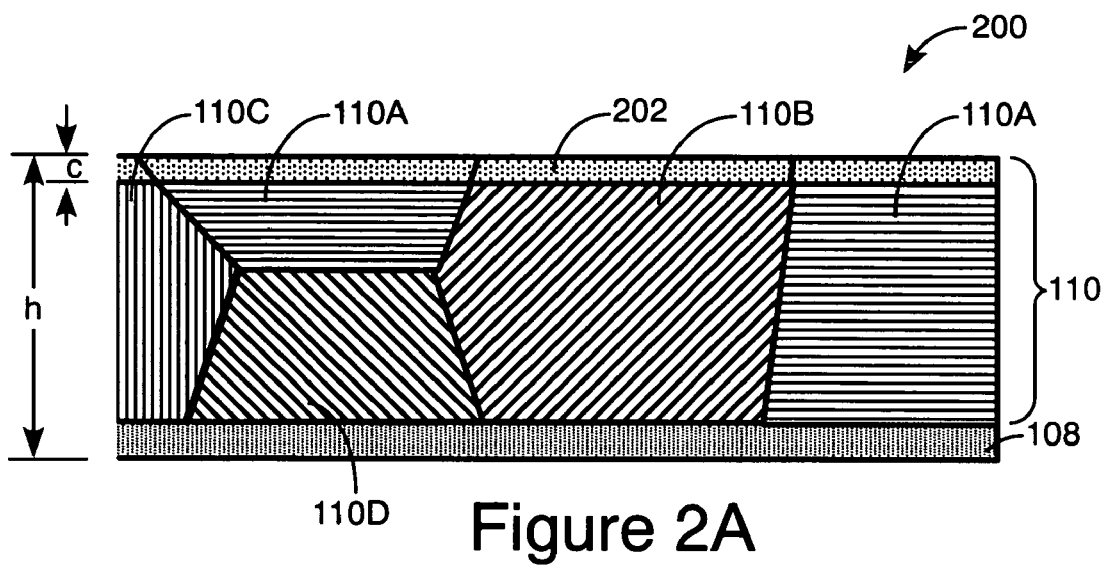
FIGS. 2A and 2B are cross-sectional views of layers that may be formed on a semiconductor substrate, in accordance with one embodiment of the present invention.
Figure 2B:
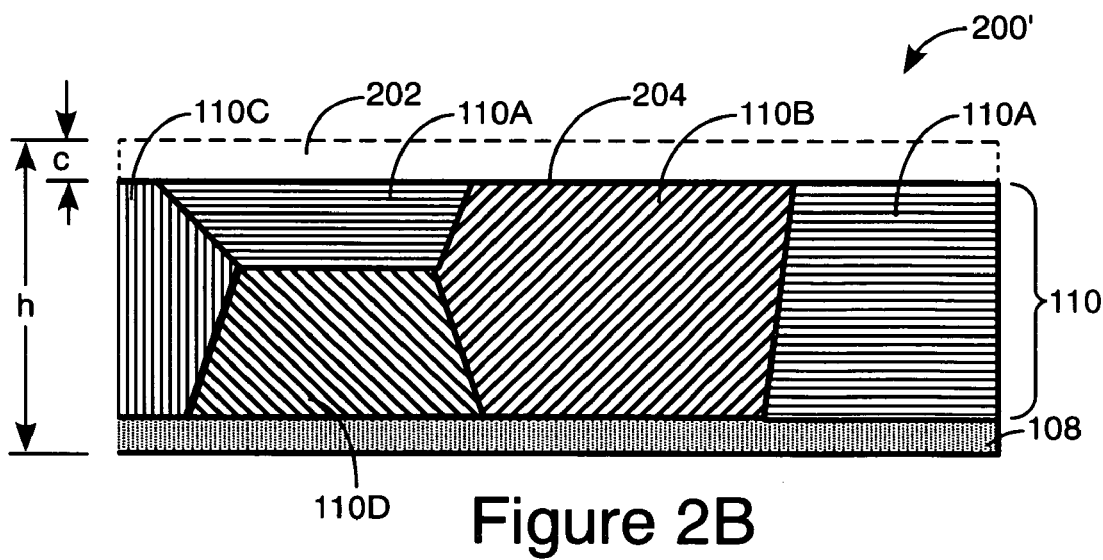
Figure 3:
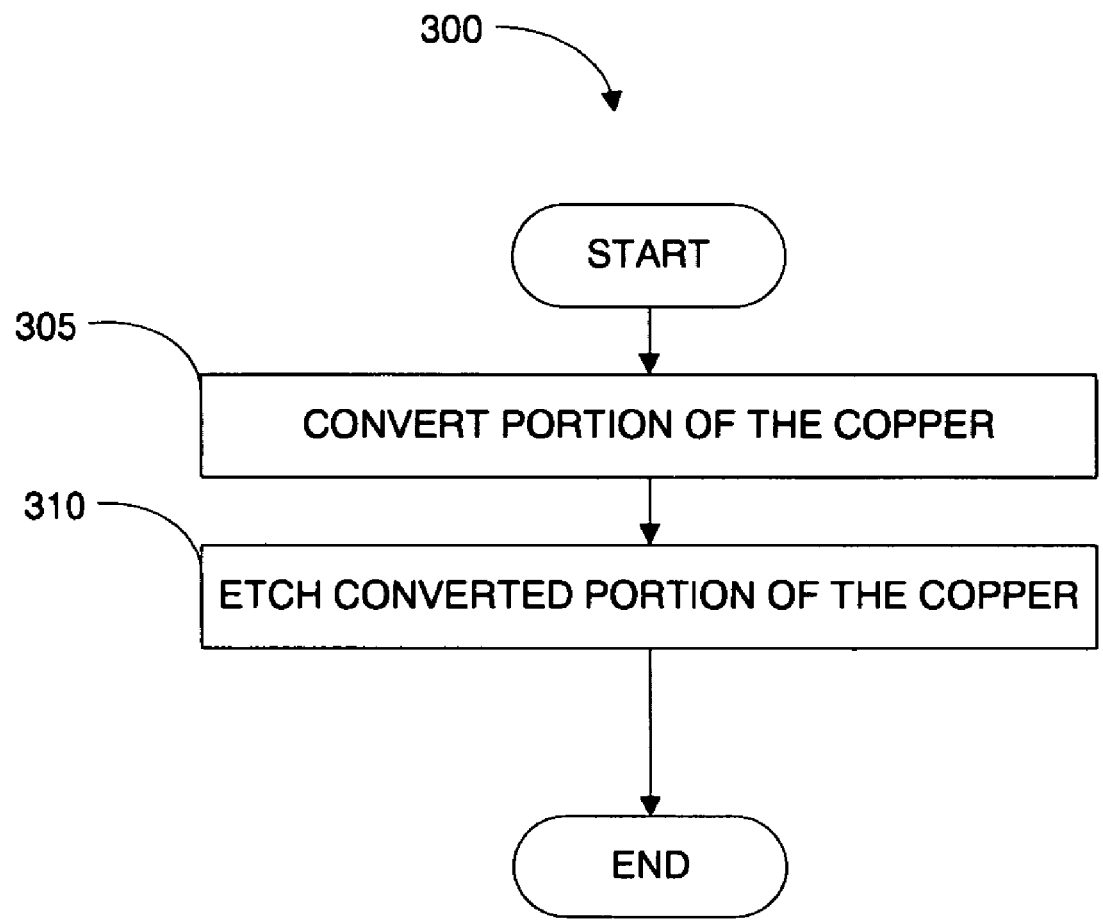
FIG. 3 is a flowchart of the method operations of converting and etching a portion of the copper layer, in accordance with one embodiment of the present invention.

FIGS. 2A and 2B are cross-sectional views of layers 108 and 110 that may be formed on a semiconductor substrate 200, in accordance with one embodiment of the present invention. FIG. 3 is a flowchart of the method operations 300 of converting and etching a portion of the copper layer 110, in accordance with one embodiment of the present invention. As shown in FIG. 2A and in an operation 305, a portion 202 of the surface of the copper layer 110 can be converted to a more uniform material. The portion 202 of the surface of the copper layer 110 can be converted as described in U.S. patent application Ser. No. 10/390,117, entitled "System, Method and Apparatus For Improved Global Dual-Damascene Planarization," by Bailey III et al. and U.S. patent application Ser. No. 10/390,520, entitled "System, Method and Apparatus For Improved Local Dual-Damascene Planarization," by Bailey III et al., both of which are incorporated herein by reference in its entirety for all purposes.

By way of example, the portion 202 of the surface of the copper layer 110 can be converted to a copper oxide or a copper nitride and combinations thereof. As the entire portion 202 substantially consists of a single, uniform material, there are no different orientation crystalline grain structures that have different orientations (e.g., different crystalline structures 110A-110D of FIGS. 1A-1C above). As a result, a subsequent etch process can provide a more uniform etch rate and more uniform etch results.

Referring again to FIG. 1A above, if the barrier layer 108 is a conductive material, then the barrier layer 108 can provide an electrical path between features 102 and 104, as a result, it is often desirable to remove the barrier layer 108. The conversion process 305 can also include converting at least a portion of the underlying layer 108. By way of example, the underlying layer 108 can be a barrier layer. The barrier layer 108 can also be converted to an oxide or nitride so that both the entire converted copper layer 110 and the converted barrier layer 108 can be removed in a single subsequent etching process. Alternatively, the barrier layer 108 can be converted and removed after the copper layer 110 has been removed.

In yet another alternative, the converting process of operation 305 can be selective to the barrier layer 108. By way of example, the conductive layer 110 can be copper and the barrier layer 108 can be Tantalum (Ta), Tantalum-Nitride (TaN), Titanium (Ti) or Titanium nitride (TiN) or other suitable material or compounds thereof. The converting process of operation 305 would convert the copper layer 110 down to the barrier layer 108 and then stop due to the converting chemistry used to convert the copper layer having a substantially slower reaction rate (e.g., about 10:1) as compared to the copper.

The conversion process 305 can include exposing the copper layer 110 to a mixture of Chlorine and Oxygen. By way of example, the mixture of Chlorine and Oxygen can include about 50% Chlorine and about 50% Oxygen. Alternatively, the conversion process 305 can include exposing the copper layer 110 to a mixture of about 50% Argon and about 50% Oxygen. Alternatively, the conversion process 305 can include exposing the copper layer 110 to a mixture of about 50% Argon and about 50% Nitrogen. One or more of Xenon, Hydrogen ($H_2$), Chlorine ($Cl_2$), Bromine ($Br_2$) and hydrochloric acid (HCl) can also be mixed with Oxygen in the conversion process 305. In yet another alternative, the conversion process 305 can include exposing the copper layer 110 to one or more of Carbon monoxide (CO), Carbon dioxide ($CO_2$) or Nitrous oxide ($N_2O$) to convert the copper layer 110.

The conversion process 305 may be performed with a plasma. Alternatively, the conversion process 305 may be performed without a plasma. The conversion process 305 can be performed at a temperature of between less than about −20 degrees C. and greater than about 300 degrees C. The conversion process 305 can be performed in any suitable process chamber. By way of example the conversion process 305 can be performed within a capacitive or inductively coupled plasma chamber operated at a frequency of between less than about 2 MHz and greater than about 27 MHz. The conversion process 305 can be performed within a plasma chamber such as described in U.S. patent application Ser. No. 10/744,355 filed on Dec. 22, 2003 and entitled "Small Volume Process Chamber with Hot Inner Surfaces," by Bailey III et al., which is incorporated herein by reference in its entirety.

The conversion process 305 may be performed at a pressure of between about 1 mTorr to about 1 Torr. The conversion process 305 may require between less than about 20 seconds to more than about 1 minute. The conversion process 305 can convert between less than about 100 nm and more than about 1500 nm of the top surface of the copper layer 110.

As shown in FIG. 2B and in an operation 310, the converted portion 202 of the surface of the copper layer 110 can be removed in an etch process. The etch process 310 leaves a substantially smooth surface 204 of the copper layer 110 (i.e., the surface 204 has an average surface roughness of less than about 10 nm). An average surface roughness is defined as the average difference between the peaks and valleys in a 35 micron×35 micron area of the surface 204. The etch process 310 can be performed at a temperature of between less than about −20 degrees C. and greater than about 300 degrees C.

The etch process 310 can be a wet etch or a plasma etch. By way of example, the etch process 310 can be performed in-situ in the same plasma chamber in which the conversion process 305 was performed in. Alternatively, the etch process 310 can be a wet etch performed in a wet etch in an etch tank as is well known in the art. The wet etch can also be performed by a dynamic liquid meniscus as described in FIG. 4 below and in more detail in U.S. patent application Ser. No. 10/769,498 filed on Jan. 30, 2004 and entitled "Stress Free Etch Processing in Combination with a Dynamic Liquid Meniscus," by Bailey III et al., which is incorporated herein by reference in its entirety, for all purposes.

The etch process 310 can be selective to the underlying, non-converted portion of the conductive layer 110. By way of example, if the converted portion 202 is converted to copper oxide and the remaining copper layer remains, then a selected etchant chemistry can remove the copper oxide while not substantially etching the remaining copper. An etching chemistry including $BCl_3$ is selective 10:1 copper oxide to elemental copper. The etching chemistry including $BCl_3$ can include a mixture of Argon and $BCl_3$. By way of example a etchant chemistry including $BCl_3$ can etch copper oxide at a rate of between about 400 and about 700 nm per minute and an etch rate of elemental copper of only about 60 nm per minute. Alternatively, the etching chemistry can be selective to the barrier layer 108.

In one or more of the above-described embodiments, the average surface roughness of the remaining surface can be a function of the thickness of the converted portion of the conductive layer. By way of example, if the desired thickness of the conductive layer to be removed is about 250 nm, then the $Ar/O_2$ process described above can result in the remaining surface having a surface roughness of about 10 nm. Restated, the average surface roughness is less than about 0.04 times a thickness of the converted portion of the conductive layer in the $Ar/O_2$ process.

The conversion process 305 and etching process 310 can be used iteratively to gradually convert and etch away consecutive portions of the copper 110.

The etching process 310 can include etching the converted copper with one or more concentrations of $BCl_3$. By way of example, the $BCl_3$ can be between about 10% to about 100% of the $BCl_3$/Argon mixture during the etching process 310. The substrate 100 can also be heated to a temperature of greater than about 250 degrees C. during the etching process 310. By way of example, a chuck can both support and heat the substrate 100 during the etching process 310. The etching process 310 can have an etching rate of about 100 to about 700 nm per minute.

The conversion process 305 and etching process 310 can also be substantially simultaneously. By way of example, exposing the copper layer 110 to an about 50% Argon and about 50% Oxygen mixture at about 20 degrees C. will cause the surface to the converted and etched away substantially simultaneously. Alternatively, the Argon and Oxygen mixture can include of a range of concentrations including between about 2 to about 100% Oxygen and between about 98 to about 0% Argon. The conversion process 305 can occur within a range of less than about −20 degrees C. to greater than about 300 degrees C. The substantially simultaneous conversion and etching processes can convert and remove about 10 nm to about 200 nm per minute.

The conversion process 305 and the etching process 310 can be performed at different temperatures and pressures in-situ. By way of example, the conversion process 305 can be applied at temperatures greater than about 200 degrees C. and the etching process 310 can be applied at temperatures less than about 100 degrees C. This variation in temperatures can substantially reduce any copper agglomeration of very thin layers of copper such as may be remaining after the bulk of the overburden 110 has been removed.

The etching process 310 can also include an about 10% to about 100% BCl$_3$ Argon mixture with a pressure of between about 5 mT to about 100 mT and at a temperature of less than about 100 degrees C. The plasma can be generated with a top power of between about 500 W to about 2000 W and a chuck bias of between about 100 W and about 1000 W.

Figure 4:
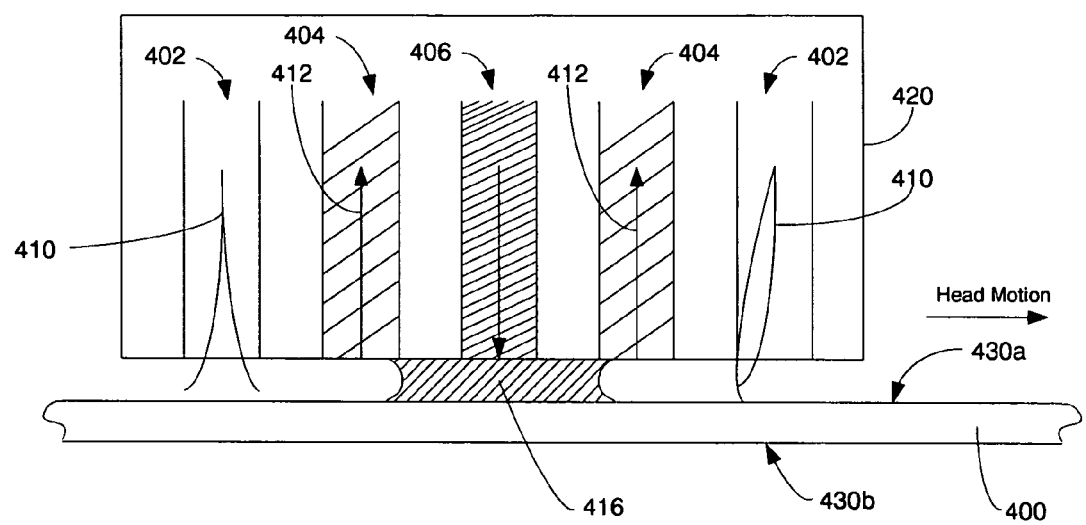
FIG. 4 illustrates a proximity head 420 capable of supporting a dynamic liquid meniscus, in accordance with one embodiment of the present invention.

FIG. 4 illustrates a proximity head 420 capable of supporting a dynamic liquid meniscus 416, in accordance with one embodiment of the present invention. The proximity head 420, in one embodiment, moves while in close proximity to the top surface 430a of the wafer 400 to conduct a cleaning, drying, etching or other processing operation. It should be appreciated that the proximity head 430 may also be utilized to process (e.g., clean, dry, etch, etc.) the bottom surface 430b of the wafer 400. In one embodiment, the wafer 400 is rotating so the proximity head 420 may be moved in a linear fashion across the surface 430a of the wafer 400. As the proximity head is moved across the surface 430a of the wafer 400, the dynamic liquid meniscus 416 is also drawn across the surface 430a. In this manner the dynamic liquid meniscus 416 can be moved across the surface 430a of the wafer 400. As the dynamic liquid meniscus 416 can be moved across the surface 430a of the wafer 400 substantially all of the fluid, particles and other loose materials are drawn off of the surface 430a. In this way, the dynamic liquid meniscus 416 substantially dries the surface 430a.

The dynamic liquid meniscus 416 is formed in a relatively narrow space between the surface 430a of the wafer 400 and the proximity head 420. The dynamic liquid meniscus 416 is formed by a vacuum 412 through source outlet 404 and a fluid 414 (e.g., deionized water, etchant chemistry, etc.) through the source inlet 406. IPA (isopropyl alcohol) 410 can be added through inlet ports 402 to assist the formation of the dynamic liquid meniscus 416. The IPA 410 reinforces the edges of the dynamic liquid meniscus 416.

The dynamic liquid meniscus 416 can support any one or more of several processes. By way of example, if an etching chemistry 416 is used to form the dynamic liquid meniscus 416, then the dynamic liquid meniscus can support an etching process that can be focused on a particular location and/or conducted across the entire surface 430a. Similarly, a rinsing fluid (e.g., deionized water) can be used to form the dynamic liquid meniscus 416 and rinse and dry the surface 430a in a single pass.

Figure 5:
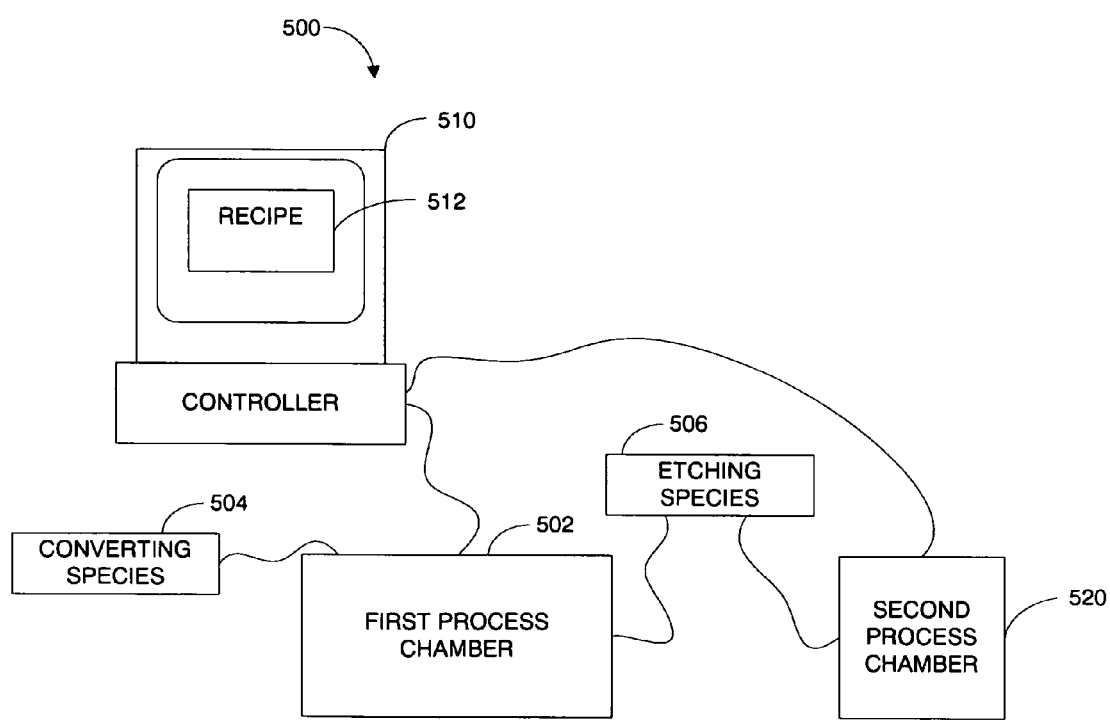
FIG. 5 is a simplified schematic diagram of a system for etching a conductive layer, in accordance with an embodiment of the present invention.

FIG. 5 is a simplified schematic diagram of a system 500 for etching a conductive layer, in accordance with an embodiment of the present invention. The system 500 includes a first process chamber 502. The first process chamber 502 can be a plasma chamber as described above. The system 500 also includes a controller 510 that is coupled to and capable of controlling the process chamber 502. The controller 510 includes a recipe 512. The recipe 512 includes all of the operating parameters of the first process chamber 502 (e.g., temperatures, pressures, flow rates, process gases, timing, sequencing, etc.) as may be desired to operate the process chamber. By way of example the recipe 512 can define the flow rate and pressure of a converting species (or combination of species) from one or more converting species sources 504 that are coupled to the first process chamber 502. Further, the recipe 512 can define the flow rate and pressure of an etching species (or combination of species) from one or more etching species sources 506 that are coupled to the first process chamber 502.

The system 500 can also include a second process chamber 520. The second process chamber 520 can be an etch chamber such as a wet etch process chamber or a process chamber for a dynamic liquid meniscus. The second process chamber 520 can also be a separate plasma chamber for performing a plasma etch as described above.

The above embodiments of converting and etching one or more conductive layers (e.g., a copper layer and/or a barrier underlying layer) have been described in the exemplary context of a copper-etch back process. It should be understood that substantially similar process could also be applied to a pattern plating process and a patterning process.

Figure 6A:
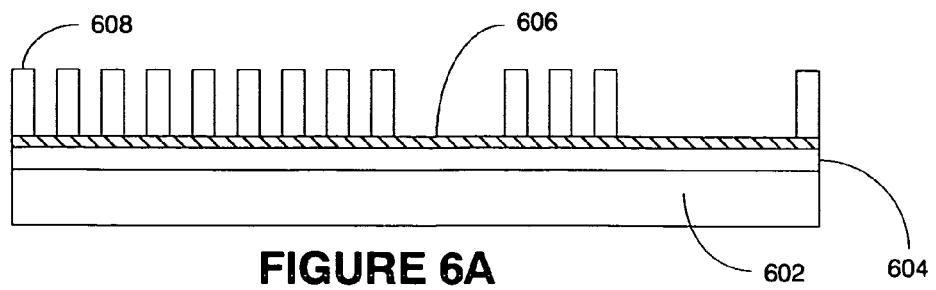
FIGS. 6A-E show a converting and etching process applied to a pattern plating process, in accordance with one embodiment of the present invention.
Figure 6B:
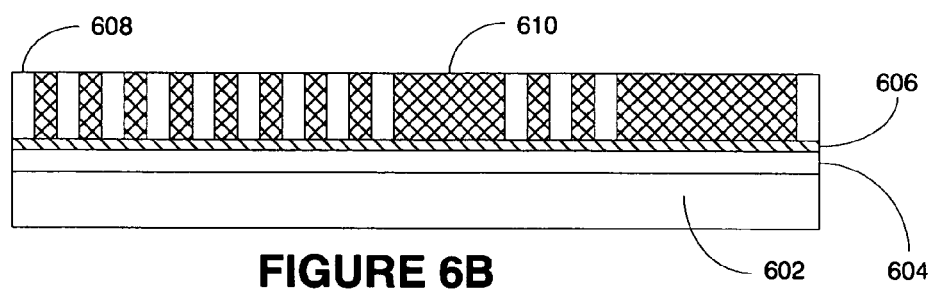

FIGS. 6A-E show a converting and etching process applied to a pattern plating process, in accordance with one embodiment of the present invention. Referring first to FIG. 6A, a substrate 602 has a first layer 604 formed thereon. A seed layer 606 is formed on the first layer 604. The seed layer can be a relatively thin layer of the material (e.g., copper) that will be formed in the pattern as shown in FIG. 6B. A pattern 608 is formed by a patterning technique. The pattern 608 can be formed in a photoresist material.

Figure 6C:
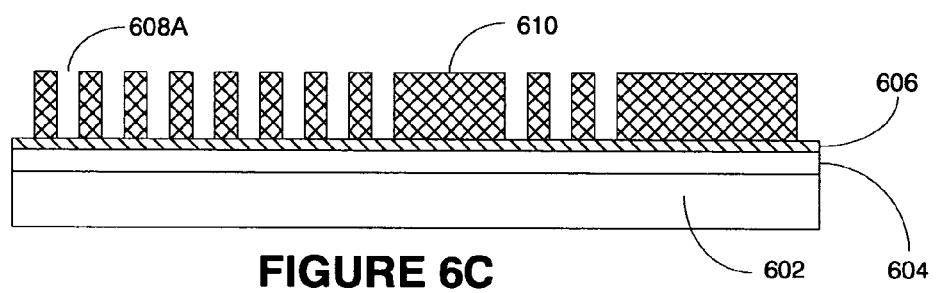

Referring now to FIG. 6B a layer of copper 610 has been deposited in the pattern 608. The seed layer assists the adhesion of the copper layer 610. As shown in FIG. 6C, the pattern 608 has been removed. The pattern 608 can be removed by any suitable method. By way of example, the photoresist material forming the pattern 608 can be removed by exposing the photoresist to the appropriate wavelength of light and then removed in a rinsing/cleaning process. Removing the pattern 608 leaves a pattern of spaces 608A between the copper layer 610 segments. As the photoresist 608 has been removed, portions of the underlying seed layer 606 is again exposed.

Figure 6D:
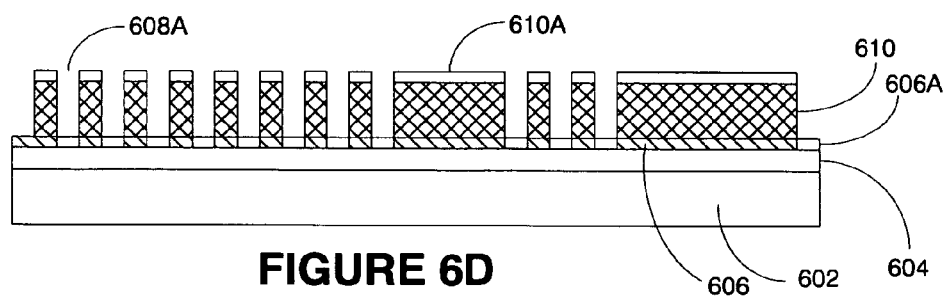

Referring now to FIG. 6D, the conversion process described in FIGS. 2A-3 above can be applied to convert (e.g. oxidize or nitride) a relatively thin top layer 610A of the copper 610. The exposed portions 606A of the seed layer 606 can also be converted (e.g. oxidized or nitrided) by the conversion process described in FIGS. 2A-3 above. The exposed portions 606A of the seed layer 606 can be converted substantially simultaneously as the relatively thin top layer 610A of the copper 610 is converted.

Figure 6E:
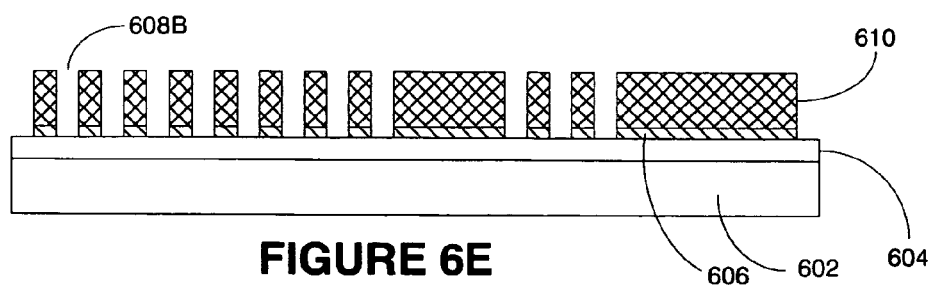

Turning now to FIG. 6E, the etching process has removed the converted relatively thin top layer 610A and the converted portions 606A of the seed layer 606. As a result, the pattern of spaces 608B between the copper layer 610 segments extends through to the first layer 604. Removing the converted portions 606A of the seed layer 606 removes undesirable conductive interconnects between the copper layer 610 segments.

Figure 7A:
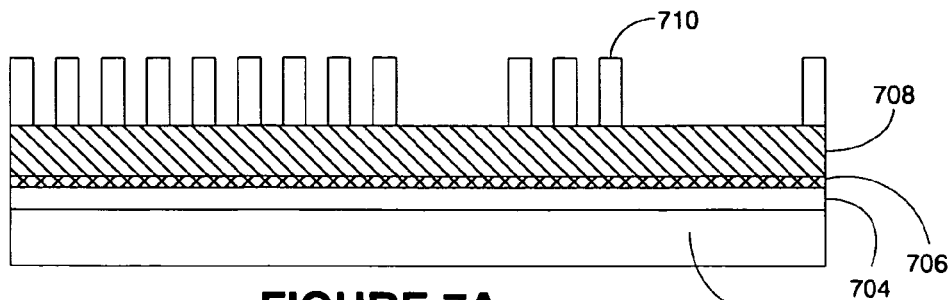
FIGS. 7A-E show a converting and etching process applied to a patterning process, in accordance with one embodiment of the present invention.

FIGS. 7A-E show a converting and etching process applied to a patterning process, in accordance with one embodiment of the present invention. Referring now to FIG. 7A, a substrate 702 has a first layer 704 formed thereon. A seed layer 706 is formed on the first layer 704. A conductive layer 708 is formed on the seed layer 706. The seed layer 706 can be a relatively thin layer of the material (e.g., copper) of the conductive layer 708. The seed layer 706 can be any other suitable material. The seed layer 706 can assist the adhesion of the copper layer 708. A pattern 710 is formed by a patterning technique. The pattern 710 can be a hard mask.

Figure 7B:
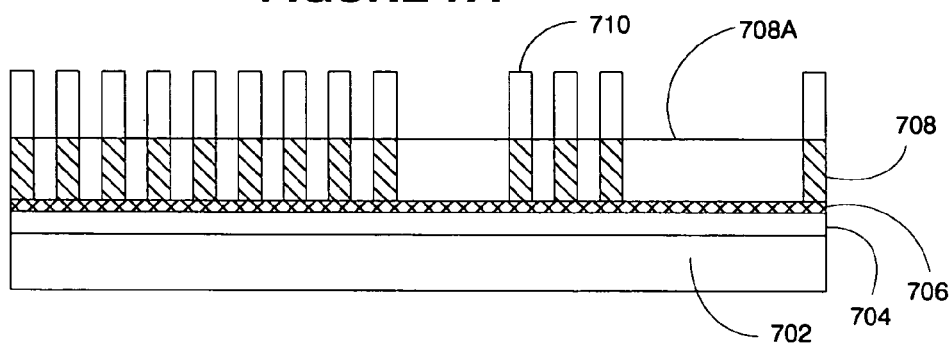
Figure 7C:
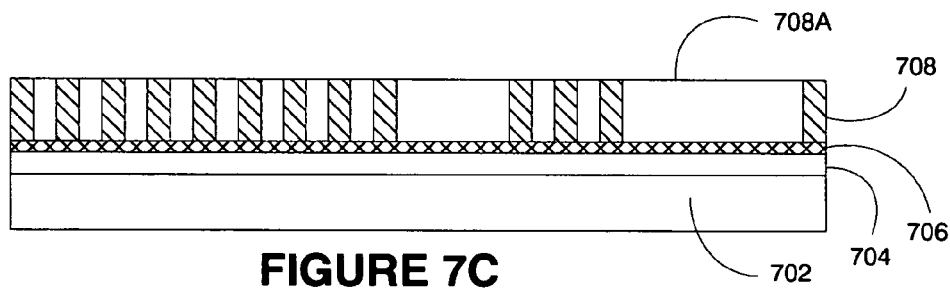

Referring now to FIG. 7B the portions 708A of the conductive layer 708 that are not covered by the pattern 710 are converted (e.g. oxidize or nitride) as described in FIGS. 2A-3 above. As shown in FIG. 7C, the pattern 710 has been removed. The pattern 710 can be removed by any suitable method. By way of example, the hard mask material forming the pattern 710 can be removed by chemical mechanical polishing (CMP).

Figure 7D:
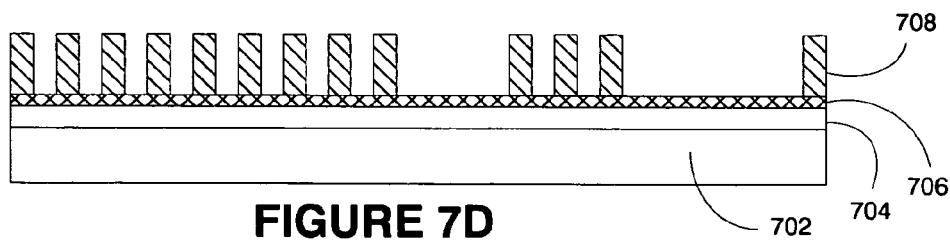

Referring now to FIG. 7D, the etching process described in FIGS. 2A-3 above can be used to remove the converted (e.g. oxidized or nitrided) portions 708A of the conductive layer 708. Removing the converted portions 708A of the conductive layer 708 can expose portions of the seed layer 706.

Figure 7E:
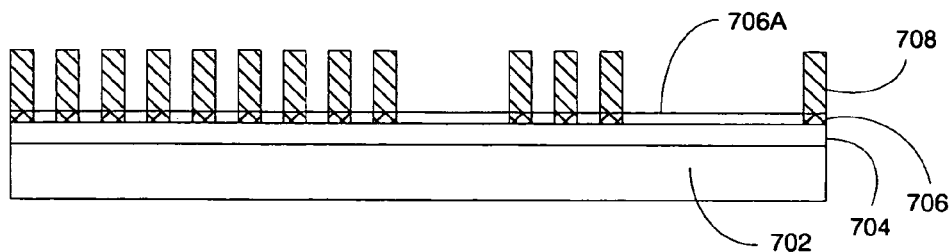

Referring now to FIG. 7E, the exposed portions 706A of the seed layer 706 can also be converted (e.g. oxidized or nitrided) by the conversion process described in FIGS. 2A-3 above. The exposed portions 706A of the seed layer 706 can be converted substantially simultaneously as the converted portions 708A of the conductive layer 708 is converted. The converted portions 706A of the seed layer 706 can be removed as described above in FIG. 6E. Removing the converted portions 706A of the seed layer 706 removes undesirable conductive interconnects between the copper layer 708A segments.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for etching a conductive layer comprising:
   a plasma chamber, the plasma chamber capable of enclosing a substrate, the substrate having an exposed layer of conductive material, the plasma chamber capable of supporting a first plasma having a temperature of greater than about 200 degrees C. and a second plasma having a temperature of less than about 100 degrees C.;
   a converting species source coupled to the plasma chamber;
   an etching species source coupled to the plasma chamber; and
   a controller coupled to the plasma chamber, the controller including computer readable code on a computer readable medium to control a flow of the converting species and the etching species into the plasma chamber, the controller including a recipe including computer readable code on a computer readable medium for converting at least a portion of the conductive layer and computer readable code on a computer readable medium for nitriding the at least a portion of the conductive layer.

2. The system of claim 1 further comprising a dynamic liquid meniscus etch process chamber.

3. The system of claim 1, wherein the controller recipe further includes:
   computer readable code on a computer readable medium for etching the conductive layer to substantially remove the converted portion of the conductive layer to expose a remaining surface, the remaining surface having an average surface roughness of less than about 10 nm.

4. The system of claim 3, wherein the conductive layer includes a copper layer or copper alloy layer.

5. The system of claim 3, wherein the computer readable code on a computer readable medium for converting the at least a portion of the conductive layer includes computer readable code on a computer readable medium for oxidizing the at least a portion of the conductive layer.

6. The system of claim 3, wherein the computer readable code on a computer readable medium for converting the at least a portion of the conductive layer and the computer readable code on a computer readable medium for etching the conductive layer to substantially remove the converted portion of the conductive layer occurs substantially simultaneously.

7. The system of claim 3, wherein the computer readable code on a computer readable medium for converting the at least a portion of the conductive layer and the computer readable code on a computer readable medium for etching the conductive layer to substantially remove the converted portion of the conductive layer occur in-situ.

8. The system of claim 3, wherein the computer readable code on a computer readable medium for etching the conductive layer to substantially remove the converted portion of the conductive layer includes etching with $BCl_3$.

9. The system of claim 3, wherein the computer readable code on a computer readable medium for converting the at least a portion of the conductive layer includes oxidizing the at least a portion of the conductive layer with an oxidizing mixture including chlorine and oxygen.

10. The system of claim 3, wherein the computer readable code on a computer readable medium for converting the at least a portion of the conductive layer includes computer readable code on a computer readable medium for oxidizing the at least a portion of the conductive layer with an oxidizing mixture including argon and oxygen.

11. The system of claim 3, wherein the computer readable code on a computer readable medium for converting the at least a portion of the conductive layer includes computer readable code on a computer readable medium for converting the at least a portion of the conductive layer having a temperature greater than about 200 degrees C.

12. The system of claim 3, wherein the computer readable code on a computer readable medium for converting the at least a portion of the conductive layer includes computer readable code on a computer readable medium for converting the at least a portion of the conductive layer in a plasma.

13. The system of claim 3, wherein the computer readable code on a computer readable medium for etching the conductive layer to substantially remove the converted portion of the conductive layer includes computer readable code on a computer readable medium for etching the conductive layer having a temperature of less than about 150 degrees C.

14. The system of claim 3, wherein the computer readable code on a computer readable medium for etching the conductive layer to substantially remove the converted portion of the conductive layer includes computer readable code on a computer readable medium for etching with a dynamic liquid meniscus.

15. The system of claim 3, wherein the computer readable code on a computer readable medium for etching the conductive layer to substantially remove the converted portion of the conductive layer includes computer readable code on a computer readable medium for etching the conductive layer in a plasma.

16. The system of claim 3, wherein the average surface roughness of the remaining surface is less than about 0.04 times a thickness of the converted portion of the conductive layer.

17. The system of claim 16, wherein the computer readable code on a computer readable medium for converting the at least a portion of the conductive layer and etching the conductive layer to substantially remove the converted portion of the conductive layer occurs substantially simultaneously.

18. The system of claim 3, wherein the conductive layer is formed on an underlying layer, the underlying layer being formed on a substrate.

19. The system of claim 18, wherein the underlying layer is a barrier layer.

20. The system of claim 18, wherein the computer readable code on a computer readable medium for converting the at least a portion of the conductive layer includes computer readable code on a computer readable medium for converting substantially the entire conductive layer and converting at least a portion of the underlying layer.

21. A system for etching a copper layer comprising:

a plasma chamber, the plasma chamber capable of enclosing a substrate, the substrate having an exposed layer of conductive material, the plasma chamber capable of supporting a first plasma having a temperature of greater than about 200 degrees C. and a second plasma having a temperature of less than about 100 degrees C.;

a converting species source coupled to the plasma chamber;

an etching species source coupled to the plasma chamber; and a controller coupled to the plasma chamber, the controller including computer readable code on a computer readable medium to control a flow of the converting species and the etching species into the plasma chamber, the controller including a recipe including:

computer readable code on a computer readable medium for oxidizing at least a portion of the copper layer with the first plasma;

computer readable code on a computer readable medium for etching the copper layer to substantially remove the oxidized portion of the copper layer to expose a remaining surface, the remaining surface having an average surface roughness of less than about 10 nm, wherein the copper layer is etched with the second plasma;

computer readable code on a computer readable medium for converting at least a portion of the conductive layer; and computer readable code on a computer readable medium for nitriding the at least a portion of the conductive layer.

* * * * *